(12) United States Patent  (10) Patent No.: US 6,653,949 B1
Cooper  (45) Date of Patent: Nov. 25, 2003

(54) DATA COMPRESSION APPARATUS AND METHOD UTILIZING TANDEM COUPLED MATRICES

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/271,196

(22) Filed: Oct. 15, 2002

(51) Int. Cl.$^7$ ................................................. H03M 7/00
(52) U.S. Cl. .......................................... 341/50; 341/106
(58) Field of Search ............................ 341/50, 106, 51, 341/63

(56) References Cited

U.S. PATENT DOCUMENTS 6,218,970 B1 * 4/2001 Jaquette ...................... 341/106

* cited by examiner

*Primary Examiner*—Brian Young
(74) *Attorney, Agent, or Firm*—Michael B. Atlass; Albert B. Cooper; Mark T. Starr

(57) ABSTRACT

A data compressor includes a plurality of tandem coupled stages, each stage comprising a matrix of AND-gates and a matrix switch. An AND-gate has inputs responsive, respectively, to a representation of a prefix code and a representation of a character for energizing the AND-gate output. The AND-gate outputs are coupled, respectively, to the inputs of the matrix switch and the matrix switch outputs have respective string codes assigned thereto. The matrix switch is controllable for coupling any one of the matrix switch inputs to a selected one of the matrix switch outputs. Energization of an AND-gate output coupled to a matrix switch output provides a representation of the code assigned thereto. The provided representations of codes assigned to the AND-gates of a stage are coupled to the prefix code inputs of the AND-gates of the next following stage. A plurality of input characters are fetched into an input buffer and the characters in the buffer stages are applied to respective character decoders at the compressor stages. The outputs of the character decoder at each stage are applied to the character inputs of the AND-gates of the stage.

27 Claims, 6 Drawing Sheets

DATA COMPRESSION APPARATUS AND METHOD UTILIZING TANDEM COUPLED MATRICES

CROSS REFERENCE TO RELATED APPLICATIONS

U.S. patent application Ser. No. 09/951,263 "Data Compression Method And Apparatus Utilizing Cascaded Sub-dictionaries" by Cooper, filed Sep. 13, 2001, discloses a cascaded subdictionary arrangement for implementing LZ type compressors.

U.S. patent application Ser. No. 10/120,467 "Hardware-Based, LZW Data Compression Co-Processor" by End, filed Apr. 11, 2002, discloses a pipelined arrangement for implementing LZ type compressors.

U.S. patent application Ser. No. 10/195,795 "Matrix Implemented Data Compression Apparatus and Method" by Cooper, filed Jul. 15, 2002, discloses a matrix implementation for LZ type compressors.

Said Ser. Nos. 09/951,263 and 10/195,795 are incorporated herein by reference.

BACKGROUND OF THE INVENTION

1. Field of the Invention

The invention relates to data compression systems based on the LZ data compression methodology and more particularly on the LZW protocols.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, Jul. 31, 1990. TIFF is a development of Aldus Corporation and the name TIFF is a Trademark thereof. Reference to the TIFF specification is found in TIFF, Revision 6.0, Final—Jun. 3, 1992.

LZW has also been adopted as the standard for V.42 bis modem compression and decompression. A reference to the V.42 bis standard is found in CCITT Recommendation V.42 bis, Data Compression Procedures For Data Circuit Terminating Equipment (DCE) Using Error Correction Procedures, Geneva 1990. The V.42 bis standard is further described in an article entitled "V.42 bis: The New Modem Compression Standard" by J. E. MacCrisken in the Spring 1991 issue of the Journal Of Data & Computer Communications—Modem Compression, pages 23–29.

Examples of LZ dictionary based compression and decompression systems are described in the following U.S. patents: U.S. Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; U.S. Pat. No. 5,861,827 by Welch et al., issued Jan. 19, 1999; U.S. Pat. No. 6,188,333 by Cooper, issued Feb. 13, 2001; and U.S. Pat. No. 6,320,523 by York et al., issued Nov. 20, 2001.

In the above dictionary based LZ compression and decompression systems, the compressor and decompressor dictionaries may be initialized with all of the single character strings of the character alphabet. In some implementations, the single character strings are considered as recognized and matched although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment, the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression systems, data character strings are stored and accessed in the compressor dictionary utilizing well known searchtree architectures and protocols. Typically, the searchtree is arranged in nodes where each node represents a character, and a string of characters is represented by a node-to-node path through the tree. When the input character stream has been matched in the dictionary tree up to a matched node, a next input character is fetched to determine if the string match will continue.

Conventionally, a determination is made to ascertain if the fetched character is already stored as an extension node of the matched node. Various techniques are utilized to effect this determination such as associative memory dictionaries, hashing and sibling lists as are well understood in the art.

In the above dictionary based systems, numerous iterative operations and dictionary accesses are required at the compressor for compressing an input stream of data characters. Normally an iteration including several dictionary accesses is required for each input data character and when utilizing an associative memory, it may be necessary to search the entire memory to determine if a string exists therein. It is desirable in such systems to minimize the number of iterative processes and dictionary accesses so as to enhance system performance.

Although the known dictionary architectures and protocols provide efficient data compression systems, it is a continuing objective in the art to improve compressor performance.

In the compressor of said Ser. No. 10/195,795, although dictionary accesses are eliminated, compressor iterations are utilized for processing sequentially fetched input characters.

SUMMARY OF THE INVENTION

The present invention replaces the conventional dictionary arrangements with digital logic elements and switches to provide a new architecture and protocols which, it is believed, will improve the performance of LZ type data compression systems. In the present invention, a plurality of input characters are fetched. The code of the longest string contained in the fetched characters that matches a previously encountered string is provided without dictionary searches and iterative operations.

The present invention is embodied in a data compressor for compressing an input stream of data characters into an output stream of compressed codes. The compressor includes a plurality of stages each including a plurality of coincidence elements, a coincidence element corresponding to a string comprised of a prefix string of at least one of the data characters followed by an extension character, a prefix string having a prefix code associated therewith. The plurality of coincidence elements provide a respective plurality of coincidence outputs. A coincidence element includes inputs responsive, respectively, to a representation of a prefix code and a representation of a character for energizing the coincidence output thereof upon coincidental energization of the inputs.

A plurality of codes are assigned to selected coincidence elements so that energization of a coincidence output of a selected coincidence element provides a representation of the code assigned thereto. The provided representations of codes assigned to the coincidence elements of a stage are coupled to the prefix code inputs of the coincidence elements of the next following stage.

A plurality of data characters are fetched from the input stream and representations of the fetched characters are coupled to the character inputs of the coincidence elements of the respective stages. A mismatching stage is determined by detecting a stage having a particular coincidence element with an energized coincidence output to which a code is not assigned. The code assigned to the coincidence element with energized coincidence output of the stage prior to the mismatching stage is outputted, thereby providing the stream of compressed codes. A next available code is assigned to said particular coincidence element to record an extended string.

Specifically, in the preferred embodiments, a switch arrangement, such as a matrix switch, is included at a stage having a plurality of switch inputs and a plurality of switch outputs, the plurality of coincidence outputs being coupled to the plurality of switch inputs, respectively. The switch is controllably operative for coupling any one of the switch inputs to a selected one of the switch outputs, so that the coincidence outputs are selectively coupled to the switch outputs. Code assignment means are included for assigning respective codes to the plurality of switch outputs so that energization of a coincidence output coupled to a switch output provides a representation of the code assigned to the switch output.

The mismatching stage is determined by detecting the stage having a particular coincidence element with an energized coincidence output that is not coupled to a switch output. The code is output that is assigned to the switch output coupled to the energized coincidence output of the coincidence element of the stage prior to the mismatching stage. The extended string is recorded by coupling the coincidence output of the particular coincidence element to the switch output of the switch of the mismatching stage to which the next available code is assigned.

DESCRIPTION OF THE PREFERRED EMBODIMENTS

The best mode embodiments described below, utilizing the matrix implementation architecture of the present invention, are predicated, generally, on the LZW methodology. The embodiments are implemented in a manner similar to that described above where the single character strings are considered as recognized by the compressor although not explicitly included therein.

Figure 1:
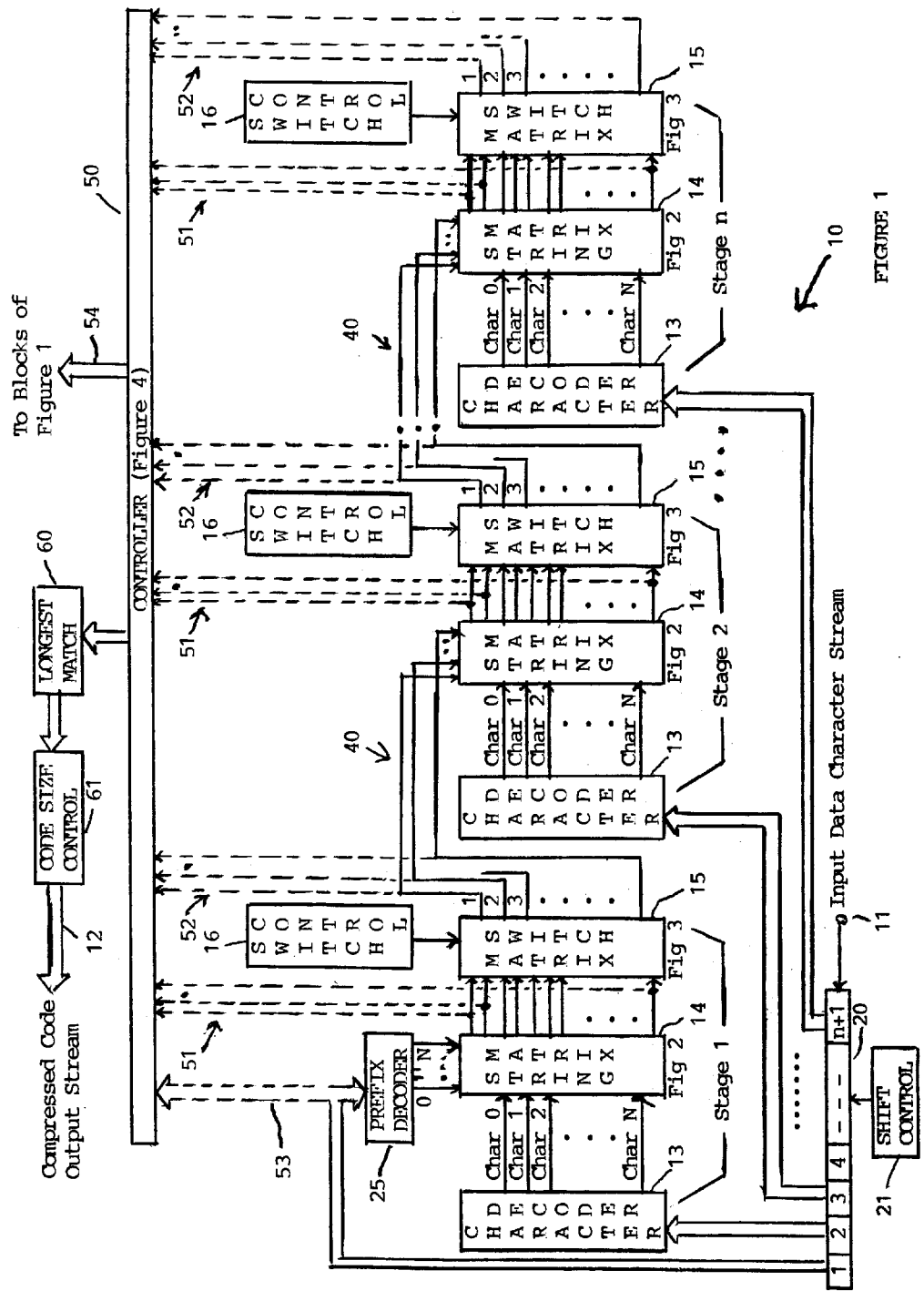
FIG. 1 is a schematic block diagram of a data compressor for compressing data in accordance with the present invention.
Figure 2:
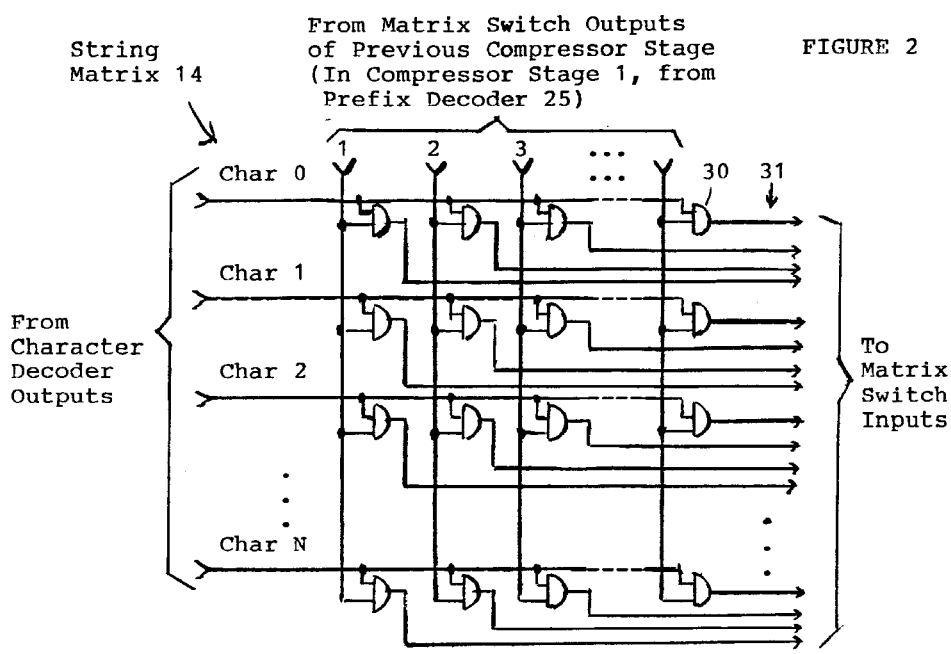
FIG. 2 is a schematic block diagram illustrating details of the string matrix of FIG. 1.
Figure 3:
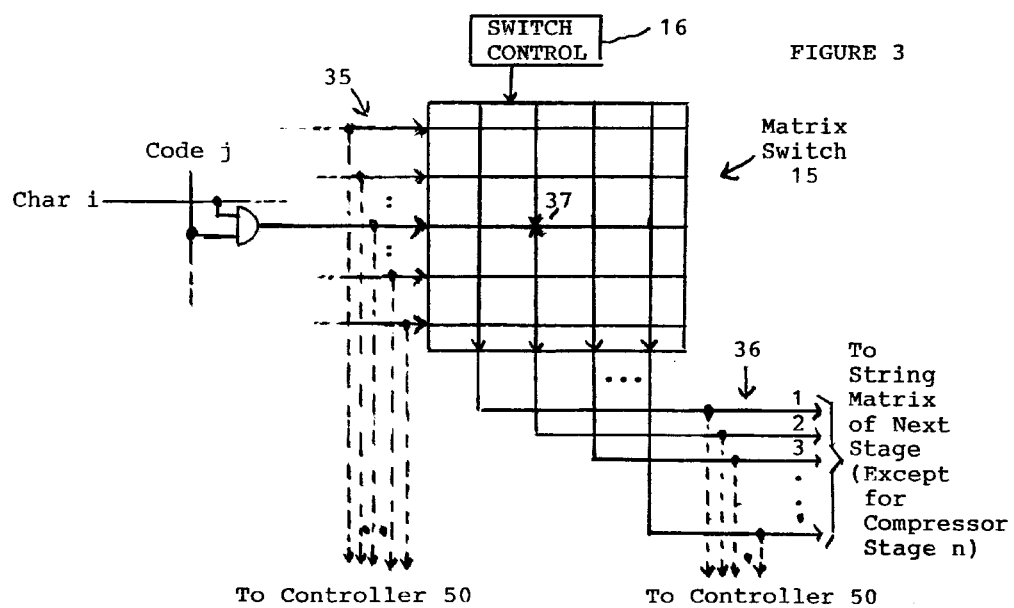
FIG. 3 is a schematic block diagram illustrating details of the matrix switch of FIG. 1.

Referring to FIG. 1, a data compressor 10 is illustrated that compresses a stream of input data characters applied at an input 11 into a stream of corresponding compressed codes at an output 12. The compressor 10 is comprised of n compressor stages denoted as stages 1 through n. Each compressor stage is comprised of a character decoder 13, a string matrix 14 and a matrix switch 15. Details of the string matrices 14 and the matrix switches 15 are illustrated in FIGS. 2 and 3 respectively. A switch control 16, coupled to each of the matrix switches 15, controls the matrix switch to selectively couple any one of the switch inputs to a selected one of the switch outputs.

An input character buffer 20 is included for holding n+1 consecutive characters from the input 11. Accordingly, the stages of the buffer 20 are denoted as 1 to n+1. By operations to be described, the compressor 10 determines the longest match of the n+1 characters in the buffer 20 with previously encountered strings recorded in the compressor 10. A shift control circuit 21 controls shifting of the buffer 20 so that new input characters are fetched into the n+1 stage while processed characters are discarded from the first stage.

The stages 2 through n+1 of the input character buffer 20 are coupled to the character decoders 13 of compressor stages 1 through n, respectively. A character decoder 13 energizes a unique output thereof in accordance with the character held in the input character buffer stage to which the decoder is coupled. The energized output of the character decoder 13 thus provides a representation of the character held in the corresponding stage of the input character buffer 20. When the alphabet over which compression is being performed comprises character values 0–N, the outputs of the character decoder 13 are accordingly denoted as char 0–char N. respectively.

Compressor stage 1 includes a prefix decoder 25 that is identical to the character decoder 13. The prefix decoder 25 is coupled to the first stage of the input character buffer 20 and energizes a unique output in accordance with the character held in the first buffer stage. The energized output of the prefix decoder 25 thus provides a representation of the character value held in the first stage of the input character buffer 20. The outputs of the prefix decoder 25 are accordingly denoted as 0–N, respectively.

A string of data characters is comprised of a prefix string of one or more characters followed by an extension character, where the prefix string has a prefix code associated therewith. Single character prefix strings conveniently utilize the character values as the prefix codes. In a manner to be described, a string is represented in a string matrix 14 and has a string code assigned thereto in a matrix switch 15.

A string code of N+3 is the first available string code assigned by the compressor 10 and a string code of M is the maximum assignable string code. The codes N+1 and N+2 may be utilized as control codes as is well known.

Referring to FIG. 2, with continued reference to FIG. 1, each string matrix 14 of each compressor stage 1 through n is comprised of a plurality of coincidence elements such as coincidence element 30. In the preferred embodiments of the invention, the coincidence elements 30 are implemented by AND-gates. The AND-gates are conveniently arranged in a matrix with the outputs of the character decoder 13 providing inputs to the matrix rows and with prefix code representations providing inputs to the matrix columns. Each intersecting row and column includes an AND-gate that receives one input from the character decoder 13 and one prefix code representation.

The plurality of AND-gates of a string matrix 14 provide a plurality of respective coincidence outputs 31. When a prefix code representation results in energization of a particular column of the string matrix 14 and the character applied to the compressor stage from the input character buffer 20 results in the energization of a particular output of the character decoder 13, the coincidence output 31 is energized of the AND-gate having inputs coupled to the particular string matrix column and the particular character decoder output.

The plurality of AND-gates of each string matrix 14 corresponds to a respective plurality of data character strings. An AND-gate corresponds to a string in accordance with the intersection of the string matrix 14 at which the AND-gate is located. For example, the AND-gate at the intersection of string matrix column 3 and char 2 row corresponds to a string having an extension character of char 2 and having a prefix string to which the code is assigned corresponding to the prefix code representation applied to column 3 of the string matrix 14.

It is appreciated that the AND-gates of the string matrix 14 of compressor stage 1 correspond to two-character-strings with single character prefixes. Representations of the single character prefix codes are provided by the outputs of the prefix decoder 25 coupled to the corresponding columns of the string matrix 14 of compressor stage 1. Representations of the extension characters are provided by the outputs of the character decoder 13 applied to the corresponding rows of the string matrix 14 of compressor stage 1. Thus, the AND-gates of the string matrix 14 of compressor stage 1 correspond to the two-character string held in the first and seconds stages of the input character buffer 20.

Referring to FIG. 3, with continued reference to FIGS. 1 and 2, details of the matrix switch 15 of each compressor stage 1 through n are illustrated. A matrix switch 15 includes a plurality of inputs 35 and a plurality of outputs 36. The matrix switch 15 is comprised of rows coupled to the matrix switch inputs 35 and columns coupled to the matrix switch outputs 36. Each row and column intersection is a controllable switch connection, such as switch connection 37, actuated by the switch control 16. The plurality of coincidence outputs 31 from the AND-gates of the stage are coupled, respectively, to the inputs 35. The switch control 16 controls the matrix switch to selectively couple any one of the switch inputs 35 to a selected one of the switch outputs 36 through the controllable switch connection, such as switch connection 37. In this manner, the coincidence outputs 31 of the AND-gates are selectively coupled to the switch outputs 36.

In a manner to be described, codes are selectively assigned to matrix switch outputs 36 of the matrix switches 15 of the compressor stages 1 through n. Energization of a coincidence output 31, coupled to a matrix switch input 35 and through the matrix switch 15 to a switch output 36, provides a representation of the code assigned to the switch output. FIG. 3 illustrates that when the connection 37 is effected by the switch control 16, the coincidence output of the AND-gate at the intersection of prefix code j and char i is coupled to the matrix switch output denoted as 2. Upon coincidental occurrence of prefix code j and the character denoted as char i, the coincidence output of the AND-gate is energized and, through the switch connection 37, enables the matrix switch output denoted as output 2. Thus, a representation of the code assigned to the matrix switch output denoted as 2 is provided.

With continued reference to FIGS. 1–3, the matrix switch outputs 36 of a matrix switch 15 of a compressor stage, except stage n, are coupled through leads 40 to the corresponding prefix code inputs of the string matrix 14 of the next compressor stage. By operations to be described, it will be appreciated that three-character strings will be recorded in stage 2, four-character strings in stage 3 and n+1 character strings in stage n.

The compressor 10 includes a controller 50 responsive to control inputs represented as dashed lines. The controller 50 receives control inputs 51 from the matrix switch inputs 35 and control inputs 52 from the matrix switch outputs 36. The control inputs are provided from each of the compressor stages 1 through n. The character value from the first stage of the input character buffer 20 is also provided to the controller 50 via control input 53. The controller 50 provides control signals to the blocks of FIG. 1, as indicated by an arrow 54, to control the operations of the compressor 10 to be performed. Further details of the controller 50 are illustrated in FIG. 4.

At the end of a compression cycle, the controller 50 provides the code of a longest matching string to a longest match register 60. The code of the longest matching string is provided to the compressor output 12 through a code size control circuit 61 that is utilized, in a well known manner, to control the number of bits utilized for transmitting the compressed code from the output 12. In an ASCII variable length code implementation, the code size may begin with 9 bits and sequentially increase to 10, 11 and 12 bits at codes 512, 1024 and 2048, respectively. It is appreciated that a fixed code size may also be utilized to implement the embodiments.

Figure 4:
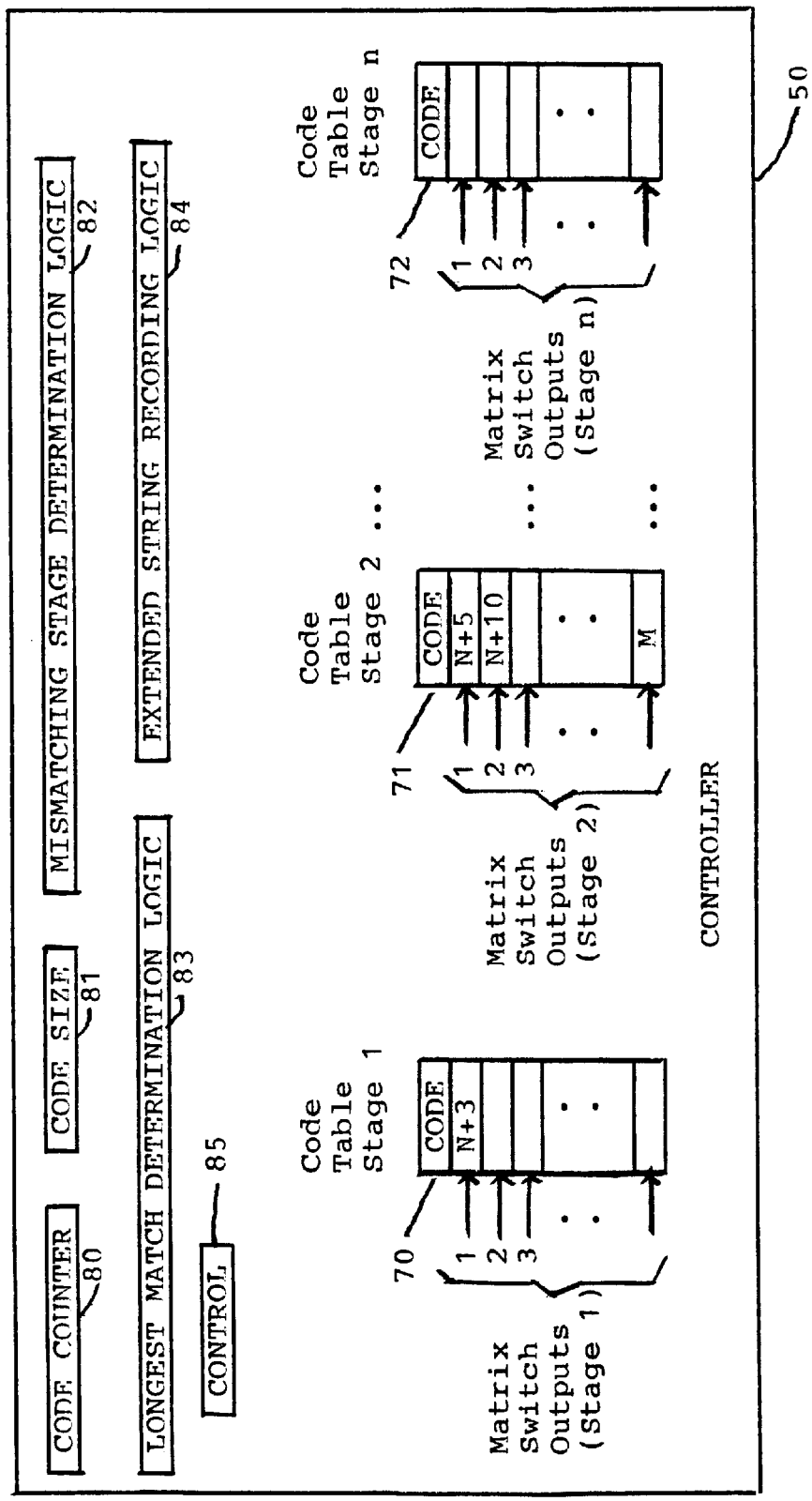
FIG. 4 is a schematic block diagram illustrating details of the controller of FIG. 1.

Referring to FIG. 4, with continued reference to FIGS. 1–3, further details of the controller 50 are illustrated. The controller 50 includes code tables 70–72 corresponding, respectively, to compressor stages 1–n. Each code table includes a plurality of locations corresponding to the respective outputs of the matrix switch 15 of the compressor stage with which the code table is associated. The codes assigned to the matrix switch outputs are stored at the corresponding locations of the code table. Codes are written into and read from the code table locations accessed by control signals from the corresponding respective matrix switch outputs as illustrated. The code tables 70–72 may, alternatively, be implemented as a two dimensional array with location access coordinates of compressor stage number and matrix switch output.

The code tables 70–72 are illustrated with multiple character string codes ranging from N+3 through M stored at various locations. In an ASCII environment, the alphabet comprises 256 characters having character values of 0–255. The first available multiple character string code may be 258 with the codes 256 and 257 utilized as control codes. When the compressor is limited to 4096 string codes in the ASCII environment, N will be 255, the maximum assignable string code M will be 4095 and the first available multiple character string code N+3 will be 258 with 256 and 257 utilized as control codes.

The controller 50 includes a code counter 80 for assigning the multiple character string codes for storage in the locations of the code tables 70–72 and thus for assignment to the outputs of the matrix switches 15. In this manner the string codes are assigned to the strings corresponding to AND-gates of the string matrices 14 in a manner to be described.

The controller 50 further includes a code size register 81 for determining the code size utilized by the code size control 61 for transmitting the compressed codes on the output 12. The code size in the code size register 81 is set in accordance with the count in the code counter 80. The code size is set to an initial value and incremented at predetermined codes of the code counter 80 until a maximum code size is attained. In the ASCII example discussed above, the code size may begin with 9 bits and sequentially increase to 10, 11 and 12 bits at codes 512, 1024 and 2048, respectively.

The controller 50 also includes mismatching stage determination logic 82, longest match determination logic 83 and extended string recording logic 84. The logic 82 determines, as the mismatching compressor stage, the lowest order stage with no energized matrix switch output.

The logic 83 detects the energized matrix switch output of the stage preceding the mismatching stage. The code in the corresponding code table at the code table location corresponding to the energized matrix switch output provides the code of the longest matching string. The code of the longest matching string is placed in the longest match register 60 for outputting at the compressor output 12.

The logic 84 records, in the mismatching stage, the encountered extended string that caused the mismatch by establishing the appropriate connection in the matrix switch 15 of the mismatching stage. Accordingly, the logic 84 establishes the connection in the matrix switch 15 of the mismatching stage between the energized matrix switch input and the matrix switch output corresponding to the next available empty location in the code table corresponding to the mismatching stage. In this manner, the coincidence output of the AND-gate of the string matrix 14 of the mismatching stage that corresponds to the mismatching encountered extended string is connected to the appropriate matrix switch output. The extant code from the code counter 80 is entered into this next available location in the code table of the mismatching stage thereby assigning the code to the matrix switch output. The code is thereby assigned to the recorded extended string.

The controller 50 also includes control circuit 85 for controlling the detailed operations to be executed by the compressor 10. The control circuit 85 is considered as containing appropriate circuitry, such as state machines, or appropriate software to control execution of the operations.

Briefly, the operation of the compressor 10 is as follows. With n+1 characters fetched from the input stream into the input character buffer 20, the compressor 10 determines the code of the longest string in the buffer 20 that matches a previously encountered string.

The character decoder 13 in each compressor stage energizes a row of the string matrix 14 of the stage in accordance with the respective character applied from the buffer 20 to the respective character decoder 13. If an AND-gate in an energized row of a string matrix of a stage corresponds to a previously encountered string, the energized coincidence output of the AND-gate is coupled through a previously established connection in the matrix switch of the stage to a matrix switch output corresponding to the code of the string. The matrix switch output is coupled through the associated lead 40 to energize the associated prefix code column of the string matrix of the next following stage. If the previously encountered string had previously been extended by the character applied to the character decoder of this next following stage, this extended string had also been recorded.

The logic 82 monitors the control inputs 51 and 52 to detect an enabled AND-gate at a stage where the coincidence output of the AND-gate is not coupled through the matrix switch of the stage to a matrix switch output. This stage is a mismatching stage since the string corresponding to the enabled AND-gate had not previously been extended by the character applied to the character decoder of the stage. This character is denoted as the mismatching character. Utilizing the logic 83, the code of the longest matching string is found in the location of the code table corresponding to the energized matrix switch output of the stage prior to the mismatching stage. Utilizing the logic 84, an extended string is recorded in the compressor 10 by establishing a connection in the matrix switch of the mismatching stage between the energized matrix switch input and the matrix switch output corresponding to the next available location in the code table of the mismatching stage. The next available code from the code counter 80 is inserted into this next available location in the code table.

The input character buffer 20 is then shifted, entering new characters from the input 11 until the mismatching character is in the first buffer stage. The compressor 10 then substantially immediately determines the code of the longest matching string contained in the fetched characters now in the buffer 20 in the manner described.

Figure 5:
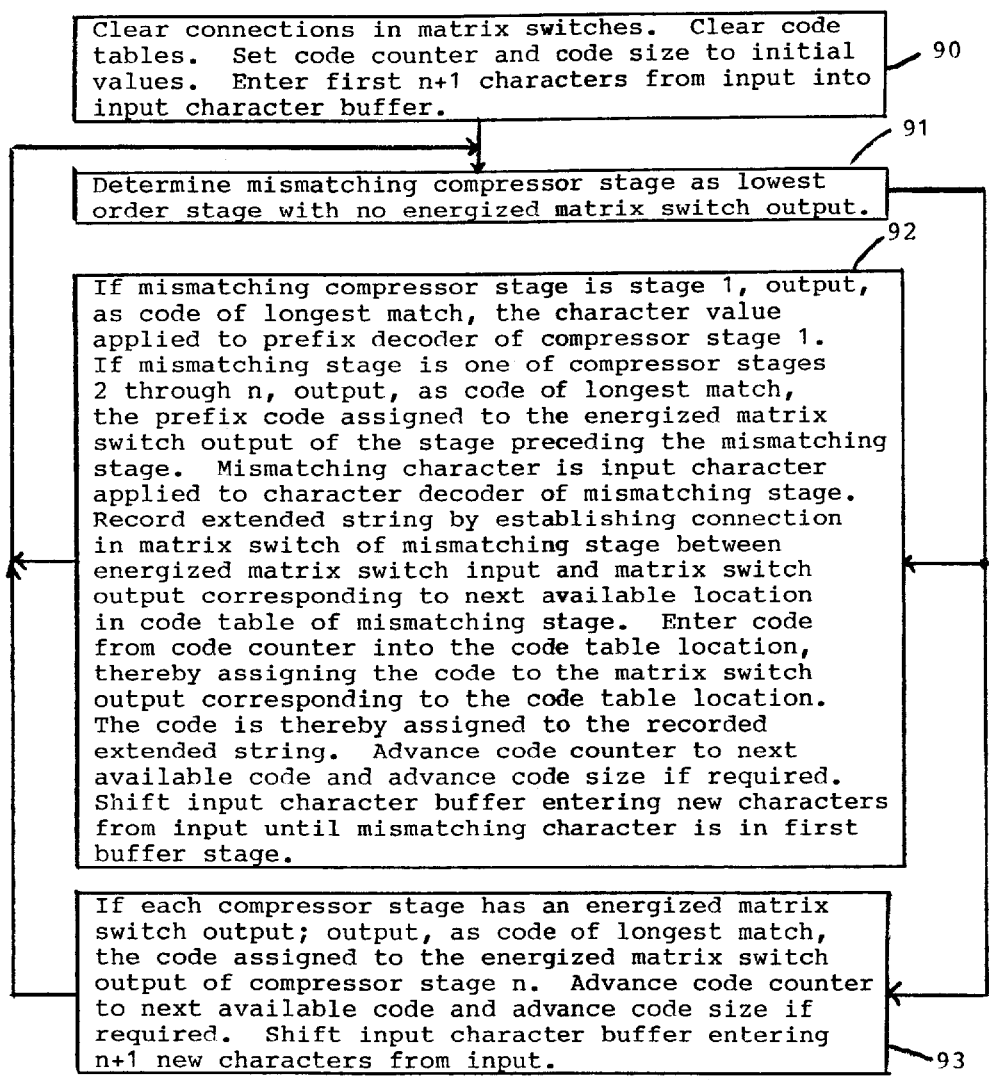
FIG. 5 is a chart summarizing the functions and illustrating the operational flow of the embodiment of FIG. 1 so as to perform data compression in accordance with the present invention.

Referring to FIG. 5, with continued reference to FIGS. 1–4, a summary and flow diagram of the operations performed by the compressor 10 is illustrated. At a block 90, the switch connections in the matrix switches 15 of compressor stages 1 through n are cleared and the locations of the code tables 70–72 corresponding to respective compressor stages 1 through n are also cleared. The code counter 80 is initialized to the first available multiple character string code and the code size register 81 is set to the initial code size. Utilizing the shift control 21, the first n+1 characters from the input 11 are shifted into the input character buffer 20.

Control proceeds to a block 91 whereat the mismatching stage determination logic 82 determines the lowest order compressor stage with no energized matrix switch output. This determination is effected by the controller 50 by examining the control inputs 52 provided from the outputs of the matrix switches 15 from the compressor stages 1 through n. If a mismatching compressor stage is detected, processing proceeds with block 92. If, however, each compressor stage has an energized matrix switch output, processing proceeds with block 93. It is sufficient to detect an energized matrix switch output from the matrix switch 15 of compressor stage n for control to continue from block 91 to block 93.

At the block 92, the code of the longest matching string is output. The code of the longest match is transferred by the controller 50 to the longest match register 60 and provided at the compressor output 12 in the appropriate number of bits controlled by the code size control 61. If the mismatching stage is compressor stage 1, the code of the longest match is the character value applied to the prefix decoder 25 of compressor stage 1. This character value is transferred to the controller 50 via the bus 53.

If the mismatching stage is one of compressor stages 2 through n, the code of the longest match is the prefix code assigned to the energized matrix switch output of the compressor stage preceding the mismatching stage. Accordingly, the code of the longest match is provided from the code table corresponding to the compressor stage preceding the mismatching stage at the code table location corresponding to the energized matrix switch output of the stage preceding the mismatching stage. The mismatching character is the input character applied to the character decoder 13 of the mismatching stage.

In the mismatching stage, the string matrix AND-gate corresponding to the longest matching string extended by the mismatching character is enabled. The energized coincidence output of the AND-gate is connected to an input of the matrix switch of the mismatching stage. This energized matrix switch input is, however, not connected through the matrix switch to a matrix switch output. Accordingly, the extended string comprising the longest match extended by the mismatching character is recorded by establishing the connection in the matrix switch of the mismatching stage between the energized matrix switch input and the matrix switch output corresponding to the next available empty location in the code table of the mismatching stage. A code is assigned to the recorded extended string by entering the extant code from the code counter 80 into this next available location in the code table for the mismatching stage.

The code counter 80 is advanced to the next available code and the code size register 81 is advanced if required. The input character buffer 20 is shifted entering new characters from the input 11 at the stage n+1 until the mismatching character is in the first buffer stage. The compressor stage at which the mismatch occurs determines the number of shifts to be applied by the shift control 21 to the input character buffer 20. For example, if compressor stage 3 is the mismatching stage, three shifts are required to bring the mismatching character in the fourth stage of the buffer 20 into the first stage thereof. It is appreciated that the already processed characters corresponding to the outputted longest matching string code are shifted out of the buffer 20 and hence discarded. Control returns from the block 92 to the block 91 to determine the code of the longest matching string now in the input character buffer 20.

When control enters block 93, an energized matrix switch output has been detected at compressor stage n. The code of the longest matching string is the code assigned to the energized matrix switch output. Conveniently, the code of the longest match is provided from the code table location corresponding to the energized matrix switch output in the code table for compressor stage n. The code counter 80 is advanced to the next available code and the code size register 81 is advanced if required. The input character buffer 20 is shifted entering n+1 new characters from the input 11. Control returns from the block 93 to the block 91 to process the new characters in the buffer.

It is appreciated that after the maximum assignable code M has been entered into a code table, advancing of the code counter 80 is terminated and no further extended strings are recorded. The compressor 10 continues to compress input data utilizing the already recorded strings until the compressor is cleared by returning to block 90.

As an alternative mode of operation in the block 93, the code counter 80 is not advanced to a next available code. When this protocol is utilized, provision should be included at a decompressor to maintain synchronism with the compressor 10.

The matrix switch 15 of a compressor stage includes a number of inputs corresponding to the number of coincidence outputs provided by the AND-gates of the string matrix 14 of the stage. The number of outputs from the matrix switch 15 is the smaller of the number of matrix switch inputs or the number of assignable string codes. The string matrix 14 of compressor stage 1 is implemented by an (N+1)×(N+1) matrix of AND-gates, where (N+1) is the number of characters in the alphabet over which compression is being performed. The string matrices 14 of compressor stages 2 through n comprise matrices of (N+1)×(number of matrix switch outputs from previous compressor stage) AND-gates. The number of locations in a code table 70–72 for a compressor stage corresponds to the number of outputs of the matrix switch 15 of the stage.

Figure 6:
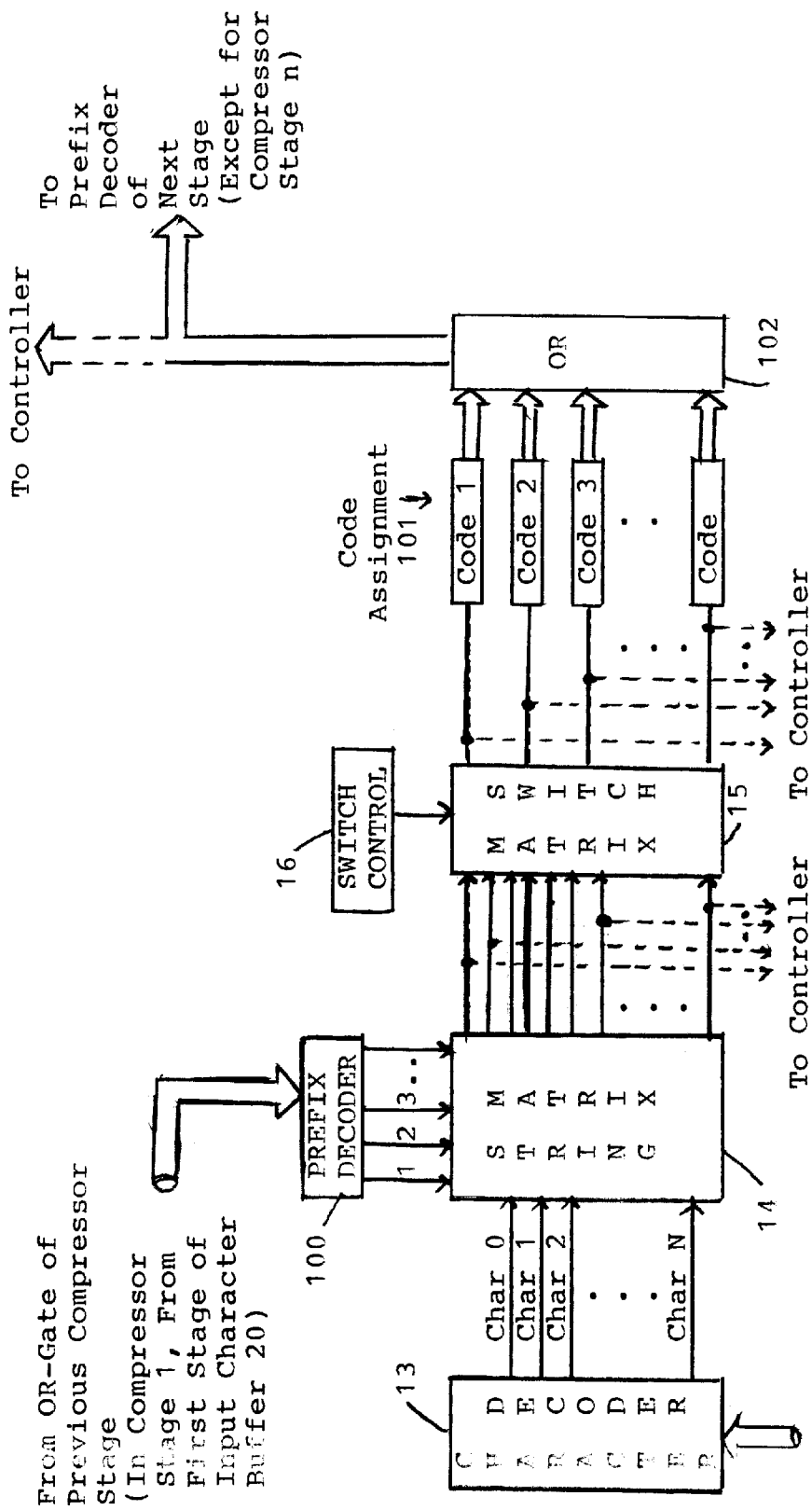
FIG. 6 is a schematic block diagram of an alternative embodiment for the stages of the compressor of FIG. 1.
Figure 7:
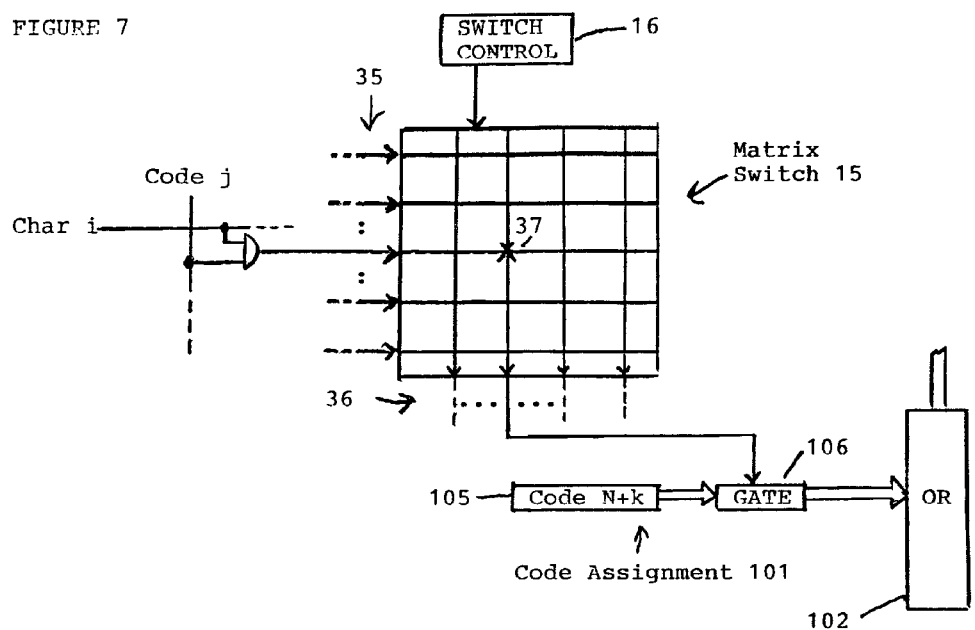
FIG. 7 is a schematic block diagram illustrating details of the matrix switch and code assignment of FIG. 6.

Referring to FIGS. 6 and 7, with continued reference to FIGS. 1–5, an alternative embodiment for implementing the stages of compressor 10 is illustrated. Like reference numerals designate like components with respect to FIGS. 1–4 and descriptions given above with respect thereto are generally applicable to FIGS. 6 and 7.

Instead of utilizing the leads 40 of FIG. 1 and the code tables 70–72 of FIG. 4, a compressor stage of the embodiment of FIGS. 6 and 7 includes a prefix decoder 100, code assignment elements 101 and an OR-gate 102. FIG. 7 illustrates that a code assignment element 101 is comprised of a code register 105 and a gate 106.

In compressor stage 1, the prefix decoder 100 is identical to the prefix decoder 25 of FIG. 1 and the controller also receives the control input 53, as illustrated in FIG. 1, conveying the character value from the first stage of input character buffer 20. In compressor stages 2 through n, the prefix decoder 100 energizes a unique output thereof in accordance with the value of the prefix code provided thereto from the OR-gate 102 of the previous stage. The uniquely energized output of the prefix decoder 100 thus provides a representation of the prefix code from the previous compressor stage. The outputs of the prefix decoder 100 provide prefix code inputs to the respective columns of the string matrix 14 of the compressor stage.

The plurality of outputs of the matrix switch 15 are coupled, respectively, to a plurality of code assignment elements 101. The code assignment elements 101 assign codes to the respective matrix switch outputs, and thus to the selectively coupled matrix switch inputs, for the purposes described above with respect to the code tables 70–72 of FIG. 4. Energization of a matrix switch output results in the associated code assignment element 101 providing the assigned code in binary format to the OR-gate 102. For a compressor stage, except stage n, the prefix code output from the OR-gate 102 is applied to the prefix decoder 100 of the next stage.

With reference to FIG. 7, a code assignment element 101 is comprised of a register 105 and a gate 106. The register 105 is illustrated as holding code N+k. When a connection 37 is effected by the switch control 16, the coincidence output of the AND-gate at the intersection of prefix code j and extension character char i is coupled to the gate 106. Upon coincidental occurrence of the prefix code and extension character, as illustrated, the coincidence output of the AND-gate is energized and through the switch connection 37 enables the gate 106. The code N+k in the register 105 is transmitted through the enabled gate 106 to the OR-gate 102.

In the embodiment of FIGS. 6 and 7, it is appreciated that the assigned string codes are stored in the registers 105 of the code assignment elements 101 rather than in the code tables 70–72 as previously described with respect to FIG. 4. The controller maintains a record of the next available register 105 for each compressor stage so that next available string codes are stored in the appropriate registers.

Figure 8:
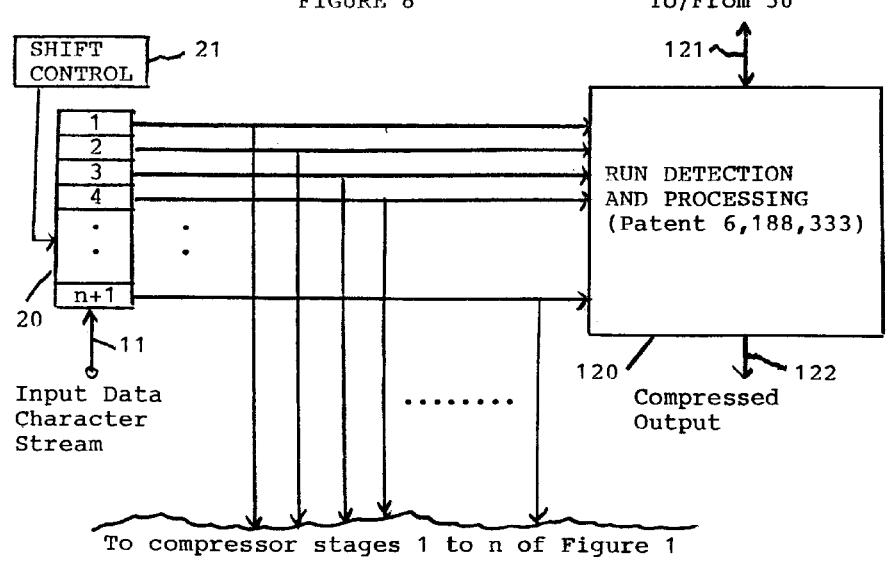
FIG. 8 is a schematic block diagram of an addition to the embodiment of FIG. 1 for providing enhanced processing of data character runs.

Referring to FIG. 8, where like reference numerals indicate like components with respect to FIG. 1 and with continued reference to FIG. 1, an addition to FIG. 1 for providing enhanced processing of data character runs is illustrated. A block 120 schematically represents the run detection and processing of the compressor of said patent U.S. Pat. No. 6,188,333 which is incorporated herein in its entirety. The compression apparatus of the block 120 communicates with the controller 50 via a bus 121 and provides compressed codes at an output 122. The compressor 120 utilizes the input buffer 20 and the shift control 21 to provide the input look-ahead data required by the apparatus 120. In the embodiment of FIG. 8, data character runs are processed by the apparatus 120 while non-run input data is processed by the above described embodiments.

It is appreciated that the compressed code output provided by the above-described embodiments is compatible with standard LZW decompressors and the data character stream corresponding to the compressed code can be recovered thereby. Furthermore, it is appreciated that although the above disclosed embodiments are described utilizing LZW data compression protocols, it is appreciated that the architecture of the present invention can be readily utilized with other data compression protocols such as, for example, LZ2.

In selecting a number of compressor stages in which to implement an embodiment, the statistics of the input data can be analyzed to choose an appropriate number of stages so as to optimize performance. The number of stages can also be chosen so that there will usually be a mismatching compressor stage at which to record an extended string.

The embodiments of the present invention are substantially universal with respect to alphabet size. With, for example, (N+1) selected as a limiting alphabet size, smaller alphabets are accommodated by adjusting the codes stored in the code tables 70–72 or in the code assignment registers 105. For example, with a 256 character alphabet, N may be 255 with the first assignable code N+3 as 258. With a 4 character alphabet, N may be 3 with the first assignable code N+3 as 6.

It is appreciated that the matrix switches 15 and the code tables 70–72 (code assignment elements 101) assign a plurality of codes to selected coincidence elements, respectively, so that energization of a coincidence output of a selected coincidence element provides a representation of the code assigned thereto.

It is further appreciated that the input data characters can be over any size alphabet having any corresponding character bit size. For example, the data characters can be textual data, image pixel data or bit map data. The input data can also be binary characters over the two-character binary alphabet 1 and 0 having a 1-bit size character.

While the invention has been described in its preferred embodiments, it is to be understood that the words which have been used are words of description rather than of limitation and that changes may be made within the purview of the appended claims without departing from the true scope of the invention in its broader aspects.

What is claimed is:

1. Data compression apparatus for compressing an input stream of data characters into an output stream of compressed codes, comprising a plurality of compressor stages each including a plurality of coincidence elements, a coincidence element corresponding to a string comprised of a prefix string of at least one of said data characters followed by an extension character, a prefix string having a prefix code associated therewith, said plurality of coincidence elements providing a respective plurality of coincidence outputs, a coincidence element having inputs responsive, respectively, to a representation of a prefix code and a representation of a character for energizing the coincidence output thereof upon coincidental energization of the inputs thereof, means for assigning a plurality of codes to selected coincidence elements so that energization of a coincidence output of a selected coincidence element provides a representation of the code assigned thereto, means for coupling the provided representations of codes assigned to the coincidence elements of a compressor stage to the prefix code inputs of the coincidence elements of the next following compressor stage, means for fetching a plurality of data characters from said input stream and applying said fetched characters to respective compressor stages, means, at said respective compressor stages, for coupling representations of said fetched characters to the character inputs of the coincidence elements of said respective compressor stages, means for detecting a compressor stage having a particular coincidence element with an energized coincidence output to which a code is not assigned, thereby determining a mismatching compressor stage, and means for outputting the code assigned to the coincidence element with energized coincidence output of the compressor stage prior to said mismatching compressor stage, thereby providing said stream of compressed codes, said means for assigning being operative for assigning a next available code to said particular coincidence element.

2. The apparatus of claim 1 wherein said means for assigning includes switch means at a compressor stage, having a plurality of switch inputs and a plurality of switch outputs, said plurality of coincidence outputs of said coincidence elements of the compressor stage being coupled to said plurality of switch inputs, respectively, said switch means being controllably operative for coupling any one of said switch inputs to a selected one of said switch outputs so that said coincidence outputs are selectively coupled to said switch outputs, and code assignment means for assigning respective codes to said plurality of switch outputs so that energization of a coincidence output coupled to a switch output provides a representation of the code assigned to the switch output, thereby providing the representation of the code assigned to the coincidence element.

3. The apparatus of claim 2 wherein said means for detecting is operative for determining said mismatching compressor stage by detecting the compressor stage having said particular coincidence element with an energized coincidence output that is not coupled to a switch output.

4. The apparatus of claim 2 wherein said means for outputting comprises means for outputting the code assigned to the switch output coupled to the energized coincidence output of the coincidence element of the compressor stage prior to said mismatching compressor stage.

5. The apparatus of claim 2 wherein said means for assigning is operative for coupling the coincidence output of said particular coincidence element to the switch output of the switch means of said mismatching compressor stage to which said next available code is assigned.

6. The apparatus of claim 1 wherein said plurality of coincidence elements comprises a plurality of AND-gates.

7. The apparatus of claim 1 wherein said plurality of coincidence elements comprises a matrix of coincidence elements.

8. The apparatus of claim 2 wherein said switch means comprises a matrix switch.

9. The apparatus of claim 2 wherein said code assignment means comprises a plurality of code tables associated with said respective compressor stages, each said code table having a plurality of locations corresponding, respectively, to the switch outputs of the switch means at the associated compressor stage, said locations holding the codes assigned to said switch outputs.

10. The apparatus of claim 2 wherein said code assignment means comprises
a code register for holding one of said codes, and
a transmission gate coupled to said code register and enabled by a switch output for transmitting the code in said code register upon energization of said switch output.

11. The apparatus of claim 2 wherein said means for coupling the provided representations of codes comprises means for directly coupling said plurality of switch outputs to a respective plurality of prefix code inputs of the coincidence elements.

12. The apparatus of claim 1 wherein said means for coupling the provided representations of codes comprises
a code decoder responsive to a prefix code for providing a plurality of outputs corresponding to a respective plurality of prefix codes, a unique decoder output being energized in accordance with the prefix code applied thereto,
said outputs of said code decoder providing said representations of codes to said prefix code inputs of the coincidence elements.

13. The apparatus of claim 1 wherein said data characters are from an alphabet of data characters and wherein said means for coupling said representations of fetched characters comprises
a plurality of character decoders at said respective compressor stages, said plurality of fetched characters being applied to said plurality of character decoders, respectively, each character decoder providing a plurality of outputs corresponding to the respective characters of said alphabet, a unique decoder output being energized in accordance with the character applied to the character decoder,
the outputs of the character decoder at a compressor stage providing said representations of data characters to the character inputs of the coincidence elements of the compressor stage.

14. The apparatus of claim 1 wherein said means for fetching comprises
an input buffer for holding said plurality of data characters fetched from said input stream and for applying said fetched characters to said respective compressor stages, and
means for shifting said plurality of data characters in said input buffer so that the character applied to said mismatching compressor stage is shifted to a first stage of said input buffer so as to provide the first character of a next longest match.

15. The apparatus of claim 14 wherein said shifting means is operative to shift new data characters from said input stream into said input buffer.

16. The apparatus of claim 1 wherein said means for coupling the provided representations of codes further includes
a code decoder at the first compressor stage responsive to character values for providing a plurality of outputs corresponding to respective characters, a unique decoder output being energized in accordance with the character value applied thereto,
said outputs of said code decoder providing said representation of codes to the prefix code inputs of the coincidence elements of said first compressor stage.

17. The apparatus of claim 1 wherein said means for fetching comprises an input buffer for holding said plurality of data characters fetched from said input stream and for applying said fetched characters to said compressor stages, said compression apparatus further including
run detection and processing means responsive to the data characters held in said input buffer for detecting a data character run in said input stream and providing an output stream of compressed codes corresponding to said run.

18. Data compression apparatus for compressing an input stream of data characters into an output stream of compressed codes, comprising
a plurality of compressor stages each including a plurality of coincidence elements, a coincidence element corresponding to a string comprised of a prefix string of at least one of said data characters followed by an extension character, a prefix string having a prefix code associated therewith, said compressor stages including a last compressor stage,
said plurality of coincidence elements providing a respective plurality of coincidence outputs, a coincidence element having inputs responsive, respectively, to a representation of a prefix code and a representation of a character for energizing the coincidence output thereof upon coincidental energization of the inputs thereof,
means for assigning a plurality of codes to selected coincidence elements so that energization of a coincidence output of a selected coincidence element provides a representation of the code assigned thereto,
means for coupling the provided representations of codes assigned to the coincidence elements of a compressor stage to the prefix code inputs of the coincidence elements of the next following compressor stage,
means for fetching a plurality of data characters from said input stream and applying said fetched characters to respective compressor stages,
means, at said respective compressor stages, for coupling representations of said fetched characters to the character inputs of the coincidence elements of said respective compressor stages, and
means for outputting the code assigned to the coincidence element with energized coincidence output of said last compressor stage, thereby providing said stream of compressed codes.

19. A data compression method for compressing an input stream of data characters into an output stream of compressed codes, comprising providing a plurality of compressor stages each including a plurality of coincidence elements, a coincidence element corresponding to a string comprised of a prefix string of at least one of said data characters followed by an extension character, a prefix string having a prefix code associated therewith, said plurality of coincidence elements providing a respective plurality of coincidence outputs, a coincidence element having inputs responsive, respectively, to a representation of a prefix code and a representation of a character for energizing the coincidence output thereof upon coincidental energization of the inputs thereof, assigning a plurality of codes to selected coincidence elements so that energization of a coincidence output of a selected coincidence element provides a representation of the code assigned thereto, coupling the provided representations of codes assigned to the coincidence elements of a compressor stage to the prefix code inputs of the coincidence elements of the next following compressor stage, fetching a plurality of data characters from said input stream and applying said fetched characters to respective compressor stages, at said respective compressor stages, coupling representations of said fetched characters to the character inputs of the coincidence elements of said respective compressor stages, detecting a compressor stage having a particular coincidence element with an energized coincidence output to which a code is not assigned, thereby determining a mismatching compressor stage, outputting the code assigned to the coincidence element with energized coincidence output of the compressor stage prior to said mismatching compressor stage, thereby providing said stream of compressed codes, and assigning a next available code to said particular coincidence element.

20. The method of claim 19 wherein said assigning step includes providing switch means at a compressor stage, having a plurality of switch inputs and a plurality of switch outputs, said plurality of coincidence outputs of said coincidence elements of the compressor stage being coupled to said plurality of switch inputs, respectively, said switch means being controllably operative for coupling any one of said switch inputs to a selected one of said switch outputs so that said coincidence outputs are selectively coupled to said switch outputs, and assigning respective codes to said plurality of switch outputs so that energization of a coincidence output coupled to a switch output provides a representation of the code assigned to the switch output, thereby providing the representation of the code assigned to the coincidence element.

21. The method of claim 20 wherein said detecting step comprises determining said mismatching compressor stage by detecting the compressor stage having said particular coincidence element with an energized coincidence output that is not coupled to a switch output.

22. The method of claim 20 wherein said outputting step comprises outputting the code assigned to the switch output coupled to the energized coincidence output of the coincidence element of the compressor stage prior to said mismatching compressor stage.

23. The method of claim 20 wherein said assigning step comprises coupling the coincidence output of said particular coincidence element to the switch output of the switch means of said mismatching compressor stage to which said next available code is assigned.

24. The method of claim 20 wherein said code assignment step comprises providing a plurality of code tables associated with said respective compressor stages, each said code table having a plurality of locations corresponding, respectively, to the switch outputs of the switch means at the associated compressor stage, said locations holding the codes assigned to said switch outputs.

25. The method of claim 19 wherein said fetching step comprises holding said plurality of data characters fetched from said input stream in an input buffer and applying said fetched characters to said respective compressor stages, and shifting said plurality of data characters in said input buffer so that the character applied to said mismatching compressor stage is shifted to a first stage of said input buffer so as to provide the first character of a next longest match.

26. The method of claim 25 wherein said shifting step includes shifting new data characters from said input stream into said input buffer.

27. A data compression method for compressing an input stream of data characters into an output stream of compressed codes, comprising providing a plurality of compressor stages each including a plurality of coincidence elements, a coincidence element corresponding to a string comprised of a prefix string of at least one of said data characters followed by an extension character, a prefix string having a prefix code associated therewith, said compressor stages including a last compressor stage, said plurality of coincidence elements providing a respective plurality of coincidence outputs, a coincidence element having inputs responsive, respectively, to a representation of a prefix code and a representation of a character for energizing the coincidence output thereof upon coincidental energization of the inputs thereof, assigning a plurality of codes to selected coincidence elements so that energization of a coincidence output of a selected coincidence element provides a representation of the code assigned thereto, coupling the provided representations of codes assigned to the coincidence elements of a compressor stage to the prefix code inputs of the coincidence elements of the next following compressor stage, fetching a plurality of data characters from said input stream and applying said fetched characters to respective compressor stages, at said respective compressor stages, coupling representations of said fetched characters to the character inputs of the coincidence elements of said respective compressor stages, and outputting the code assigned to the coincidence element with energized coincidence output of said last compressor stage, thereby providing said stream of compressed codes.

* * * * *